(12) United States Patent
Reynolds

(10) Patent No.: US 8,139,340 B2
(45) Date of Patent: Mar. 20, 2012

(54) CONDUCTIVE SEAL RING ELECTROSTATIC CHUCK

(75) Inventor: Glyn J. Reynolds, Largo, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 0 days.

(21) Appl. No.: 12/689,784

(22) Filed: Jan. 19, 2010

(65) Prior Publication Data

US 2011/0026187 A1   Feb. 3, 2011

Related U.S. Application Data

(60) Provisional application No. 61/145,871, filed on Jan. 20, 2009.

(51) Int. Cl.
*H01L 21/683* (2006.01)
*H01T 23/00* (2006.01)

(52) U.S. Cl. ........................................................ 361/234

(58) Field of Classification Search ................... 361/234
See application file for complete search history.

(56) References Cited

U.S. PATENT DOCUMENTS

| | | | |
|---|---|---|---|
| 4,502,094 A | 2/1985 | Lewin et al. | |
| 5,463,525 A | 10/1995 | Barnes et al. | |
| 5,530,616 A | 6/1996 | Kitabayashi et al. | |
| 5,745,332 A | 4/1998 | Burkhart et al. | |
| 5,799,954 A * | 9/1998 | Layer | 277/614 |
| 6,373,681 B2 | 4/2002 | Kanno et al. | |
| 6,388,861 B1 | 5/2002 | Frutiger | |
| 6,475,336 B1 | 11/2002 | Hubacek | |
| 6,483,690 B1 | 11/2002 | Nakajima et al. | |
| 6,556,414 B2 | 4/2003 | Kosakai | |
| 7,071,551 B2 | 7/2006 | Hiramatsu et al. | |
| 7,092,231 B2 | 8/2006 | Hoeks et al. | |
| 7,154,731 B1 | 12/2006 | Kueper | |
| 7,209,339 B2 * | 4/2007 | Kitabayashi et al. | 361/234 |
| 7,511,935 B2 | 3/2009 | Nakash | |
| 2002/0141134 A1 | 10/2002 | Frutiger | |
| 2004/0040665 A1 | 3/2004 | Mizuno et al. | |
| 2006/0158823 A1 | 7/2006 | Mizuno et al. | |
| 2009/0059462 A1 | 3/2009 | Mizuno et al. | |
| 2009/0084183 A1 * | 4/2009 | Baan et al. | 73/618 |
| 2009/0122459 A1 | 5/2009 | Mizuno et al. | |

FOREIGN PATENT DOCUMENTS

JP   2002-009138   1/2002
WO   WO 2009/035002   3/2009

OTHER PUBLICATIONS

Publication No. JP 2004-132486; Murakami, abstract.*
JP 2004-132486, Murakami.*

* cited by examiner

*Primary Examiner* — Dharti Patel
(74) *Attorney, Agent, or Firm* — Harvey S. Kauget; Phelps Dunbar LLP

(57) ABSTRACT

The present invention provides an improved electrostatic chuck for a substrate processing system. The electrostatic chuck comprising a main body having a top surface configured to support the substrate, a power supply to apply a voltage to the main body and a sealing ring disposed between the main body and the substrate wherein the sealing ring has a conductive layer.

22 Claims, 3 Drawing Sheets

KEY

Conductive

Insulating or semi-insulating

CONDUCTIVE SEAL RING ELECTROSTATIC CHUCK

CROSS REFERENCES TO RELATED APPLICATIONS

This application claims priority from and is related to commonly owned U.S. Provisional Patent Application Ser. No. 61/145,871 filed Jan. 20, 2009, entitled: Conductive Seal Ring Electrostatic Chuck, this Provisional patent application incorporated by reference herein.

FIELD OF THE INVENTION

The present invention relates to an electrostatic chuck device, more particularly to an electrostatic chuck device for chucking and fixing a substrate in a substrate processing chamber in a semiconductor production process.

BACKGROUND

In the semiconductor industry, it is very common to process a disc-like substrate in a vacuum chamber. Often, there is a requirement to heat or cool the substrate while ensuring that a whole face of the substrate is processed. The latter requirement eliminates the possibility of clamping the substrate mechanically at its periphery and the principle of clamping the wafer electrostatically to a heat source or heat sink is well established. The basic principle involves the use of a power supply to apply a voltage to one or more electrodes embedded inside a dielectric support that in turn contacts the substrate(s) to be processed. The applied voltage creates a field that induces a charge in the surface of the substrate in contact with the dielectric support that is opposite in polarity to the charge on the electrode. The opposite charges attract each other by electrostatic attraction and thus the substrate is clamped to the support. When the charge on the electrode is removed, the electric field that it created relaxes and the charge induced on the substrate dissipates. The substrate will then detach from the support.

Though simple in concept, in practice there are many difficulties encountered with the use of electrostatic clamps or chucks (often referred to as ESCs). A large number of different embodiments have attempted to address many of these practical difficulties. One problem is encountered when the substrate is warped. The clamping force is proportional to the square of the distance between the ESC electrode and the substrate and also to the area of the substrate that is attracted: consequently, the clamping force on a warped substrate will be lower than that on a completely planar substrate. When there is a need to process warped substrates, ESCs with high clamping forces are required. High clamping forces can be generated by applying high voltages to the ESC electrodes or by the use of the Johnson-Rahbek effect. Johnson-Rahbek or J-R ESCs incorporate a leaky dielectric (with a resistivity typically in the range of 10E8 Ω-cm to 10E13 Ω-cm) to generate charge at the surface of the ESC in direct contact with the substrate. J-R ESCs generate higher forces than regular "coulombic" ESCs (with resistivities >10E14 Ω-cm) for similar applied voltages. However, the use of J-R ESCs or coulombic ESCs at high applied voltages to generate high clamping forces often makes substrate release more difficult.

The thermal coupling between ESC and substrate is often enhanced by the use of gas between them. Typically, an inert gas such as helium or argon is preferred at pressures in the range 1 Torr to 20 Torr. In order to achieve these pressures with low flows of gas, a seal ring at the periphery of the ESC is required: this seal ring usually takes the form of a raised ridge. Additional features are incorporated into the surface of the ESC to ensure uniform distribution of this gas across the whole backside surface of the substrate.

One common surface feature detail is the so-called "MCA" or "minimum contact area" ESC. Here, the surface of the ESC comprises a plurality of protrusions that are raised above the rest of the chuck surface. The area of the raised protrusions that contact the substrate is only a very small fraction (typically ~1%) of the total ESC area. There are several advantages to the MCA ESC. When a substrate is clamped to an ESC, the electrostatic attraction usually flattens the substrate, causing relative motion between the two bodies. This sliding motion can generate particles that adhere either to the back of the substrate or to the surface of the ESC. Both outcomes are undesirable in semiconductor manufacturing: particles on the backside of a substrate can fall onto the front side of the substrate below it in the cassette, reducing device yield, while particles on the surface of the ESC can cause clamping difficulties or gas leakage. An MCA ESC reduces the contact area between chuck and substrate, reducing the probability that particles will be generated. In the event that small particles are generated, they are most likely to fall into the interstices between protrusions where they do not impair ESC operation. The MCA ESC also is less likely to experience declamping problems because of the limited contact area between chuck and substrate.

Prior Art

The most common substrates in use for semiconductor manufacturing today are silicon (Si) and gallium arsenide (GaAs) wafers, though numerous other substrates such as SiC, sapphire and quartz are used in emerging technologies (e.g., LED manufacturing). In the case of silicon, many of the wafers processed have a dielectric on the back surface that contacts the chuck. Both Si and GaAs substrates are readily electrostatically clamped by the many ESCs available on the market today. However, often substrates (particularly sapphire, semi-insulating GaAs and Si with dielectric coatings on the backside) do not release quickly and cleanly from the ESC when the applied voltage is removed. In the prior art, there are three main techniques that address this problem.

The first and simplest technique uses a mechanical force to push the substrate off the ESC. This force can take the form of a plurality of pins arranged over the surface of the ESC that are actuated when declamping is required. Each pin exerts a small force on part of the substrate and their combined force overcomes any residual electrostatic attraction holding the substrate to the ESC. Gas pressure can also be applied to the back of the substrate, in addition to or without pins, to overcome the residual clamping force.

A second method uses a time varying potential applied to the ESC electrodes to dissipate the residual charge on the surface of the ESC and the back of the substrate. In one form, an evanescent sine wave is applied to the output of the ESC power supply. In another, the potential applied to the ESC is perturbed and a signal (usually a capacitance) that correlates to the residual clamping force on the wafer is monitored. The applied potential is varied until the value corresponding to the minimum residual clamping force is determined, at which time the declamping operation is commenced, usually by lifting the substrate off the ESC with pins.

A third method seeks to prevent the build up of significant charge at the interface between ESC and substrate by continuously varying the applied voltage during clamping. Often, this is achieved by the use of a multipolar chuck that consists of three or more electrodes. The electrodes are driven either by alternating current (AC) or by square wave output. At all times, there is an applied potential to a least one electrode, so the substrate experiences some clamping force. However, because the sign of the applied potential is periodically reversed, the charge carriers are constantly in motion and a large residual charge does not develop on any part of the ESC or substrate. Variants of this technique are also possible with monopolar or bipolar ESCs.

The patent literature contains references where ESCs are fabricated in such a way that metal or metal coatings contact the substrate during electrostatic clamping. For example, in U.S. Pat. No. 4,502,094, Lewin et al. describe an ESC where metal posts and an external metal tubular support contact the substrate. The purpose of said metal components is to improve the thermal contact between the wafer and the ESC and to act as a heat sink.

In U.S. Pat. No. 5,745,332, Burkhart et al. describe the use of a partial metal coating or perforated screen to provide a second electrical contact to a monopolar ESC, thereby enabling electrostatic clamping without the need to ignite a plasma.

In U.S. Pat. No. 7,154,731, Kueper describes the use of a partially metalized ESC surface to decrease radiative coupling between ESC and substrate. Here, the inventor teaches that the metallic regions of the ESC should not contact the substrate.

Disadvantages of the Prior Art

There are two main disadvantages to the use of mechanical force to remove a substrate from an ESC. If the substrate is firmly attached to the ESC and too much force is applied, the substrate is easily broken, either by pins pushing up through the substrate or if the substrate jumps off the ESC, falls and breaks on landing. Also, failing to remove the residual charge on both the ESC and wafer can create problems. In the case of the ESC, the residual charge can impair clamping or declamping of the next wafer processed. A substrate with residual charge on its surface is subject to mishandling in subsequent processing.

Use of a dechucking operation that applies a time varying potential to the ESC electrodes is a very effective technique if the substrate and processes remain constant. However, often, the type of substrate or the process recipe will change. This frequently results in the need to develop a new dechucking algorithm. Sticking during declamping can be a relatively infrequent, sporadic occurrence, and the need to process many hundreds or thousands of substrates through the equipment to determine that a new dechucking algorithm is effective can be a costly and time consuming process. In addition, sometimes a dechucking algorithm that has worked for a long time over thousands of wafers can start to fail. Usually, the cause is difficult (if not impossible) to ascertain and the only solution is to develop a new algorithm empirically.

Preventing build up of too much residual charge during processing is a very elegant solution, but the need to use a complicated and expensive multipolar ESC and power supply is a significant disadvantage. Furthermore, some implementations of the multipolar ESC approach cause the wafer to vibrate at the frequency of the applied square wave signal as each pole clamps and then releases the substrate. This vibration can generate large numbers of particles on the back side of the substrate or can damage and break thin substrates.

There are no obvious disadvantages to the inventions described in U.S. Pat. No. 5,745,332 and U.S. Pat. No. 7,154,731, but the inventors are addressing distinctly different problems from the sticking problem addressed herein. U.S. Pat. No. 5,745,332 limits its claims to monopolar ESCs while U.S. Pat. No. 7,154,731 teaches that the metal coating should be applied to regions that do not contact the substrate. In addition, in one preferred embodiment, U.S. Pat. No. 7,154,731 describes a method to protect the metal surfaces by an additional dielectric covering. This method is counter to the method taught herein.

OBJECTS OF THE INVENTION

Based on the limitations of the prior art, there is a need for an improved electrostatic chuck that reduces the mechanical force needed to remove a substrate from an electrostatic chuck and reduces the buildup of too much residual charge on the substrate from the operation of the electrostatic chuck.

Nothing in the prior art provides the benefits attendant with the present invention.

Therefore, it is an object of the present invention to provide an improvement which overcomes the inadequacies of the prior art devices and which is a significant contribution to the advancement to the processing of semiconductor substrates using an electrostatic chuck.

Another object of the present invention is to provide an improved electrostatic chuck for a substrate processing system. The electrostatic chuck comprising a main body having a top surface configured to support the substrate, a power supply to apply a voltage to the main body and a sealing ring disposed between the main body and the substrate, wherein the sealing ring has a conductive layer.

Yet another object of the present invention is to provide an improved electrostatic chuck for a substrate processing system. The electrostatic chuck comprising a main body having a top surface configured to support the substrate, a power supply to apply a voltage to the main body and a sealing ring disposed between the main body and the substrate, wherein the sealing ring is conductive.

Still yet another object of the present invention is to provide a method for fabricating a conductive seal ring of an electrostatic chuck for use in a substrate processing system, the method comprising providing the seal ring, implanting ions into the seal ring and annealing the implanted seal ring.

Another object of the present invention is to provide a method for fabricating a conductive seal ring of an electrostatic chuck for use in a substrate processing system, the method comprising providing the seal ring and applying a conductive coating to the seal ring, the application of the coating being carried out from the group consisting of sputtering, evaporation, chemical vapor deposition, pulsed laser deposition, electroplating, thermal spray, plasma spray, screen printing, painting and rubbing.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The current invention describes an electrostatic chuck structure 10 having a standard power supply 40 and the method to make it. The chuck 10 is constructed in a similar manner as taught by the prior art. However, during chuck 10 fabrication, a conductive coating is applied to the seal ring 50 of the top surface 30 of the electrostatic chuck 10 (see FIG. 1A). The resistivity and the thickness of the conductive coating are chosen to provide a coating with a sheet resistance of less than or approximately equal to 1000Ω/☐ (ohms per square). This resistance can be achieved, for example, by depositing a thin, continuous metallic film ~10 nm to 100 nm thick. For comparison, the typical resistivity of dielectric materials used to fabricate a J-R style and coulombic style electrostatic chuck is ~10E8 Ω-cm and ~10E14 Ω-cm, respectively. These surfaces have sheet resistances that are many orders of magnitude greater than 1000Ω/☐. Applying this conductive coating to the seal ring surface has the effect of ensuring rapid release of the substrate during dechucking while maintaining an effective seal to keep the leakage of gas between the wafer and chuck to minimal levels.

The conductive coating of the present invention can be applied by a number of techniques, including sputtering, evaporation, chemical vapor deposition, pulsed laser deposition, electroplating, thermal spray, plasma spray, screen printing, painting, etc. The preferred coating is one that is compatible with the process gases. For dry etch applications that use reactive gases, noble metals such as Pt, Rh, Ir, and Pd and their alloys are preferred because they are resistant to fluorine and chlorine-containing plasmas and do not form surface oxides that could trap residual charge that in turn could lead to sticking. For clamping materials other than Si, Au is also a suitable candidate. However, for economic reasons, Ni and its alloys may be more practical. Graphite has also been shown to be effective. Other common conductive coatings such as metals, (e.g., Al, Ti, Ru, Ag, etc.), metal alloys, conductive metal oxides (e.g., ITO, SnO, $RuO_2$, etc.), conductive metal nitrides (e.g., TiN, CrN, $ZrN_x$, $NbN_x$, $TaN_x$, $MoN_x$, $WN_x$, $VN_x$, etc.), conductive metal carbides (e.g., TiC, $CrC_x$, $ZrC_x$, $NbC_x$, $TaC_x$, $MoC_x$, $WC_x$, $VC_x$, etc.), conductive metal borides, conductive metal silicides, amorphous carbon, diamond-like carbon, carbon nanotubes, etc., might be suitable for some applications.

Another way to improve the release characteristics during dechucking without compromising sealing is to implant the seal ring with ions that are known to increase the conductivity of the dielectric used for the electrostatic chuck. For example, in the case of alumina ESCs, incorporating a dopant such as Ti into the alumina lattice is known to increase the conductivity.

The general principle of this invention allows for local metallization or ion implantation of parts of the ESC to minimize sticking during release. As long as sufficient electrode area remains unscreened to ensure adequate clamping force, significant fractions of the chuck surface that are in direct contact with the substrate can be metalized to prevent sticking and improve release times.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

Figure 1A:
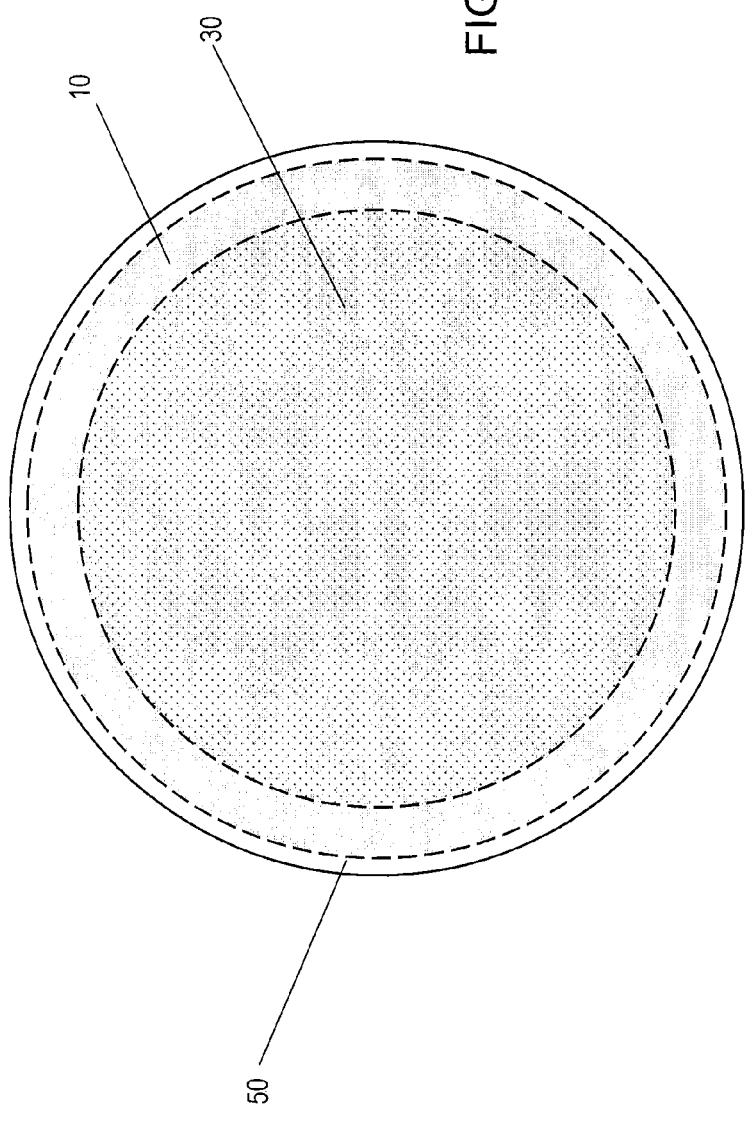
FIG. 1A is a top view of an electrostatic chuck.
Figure 1B:
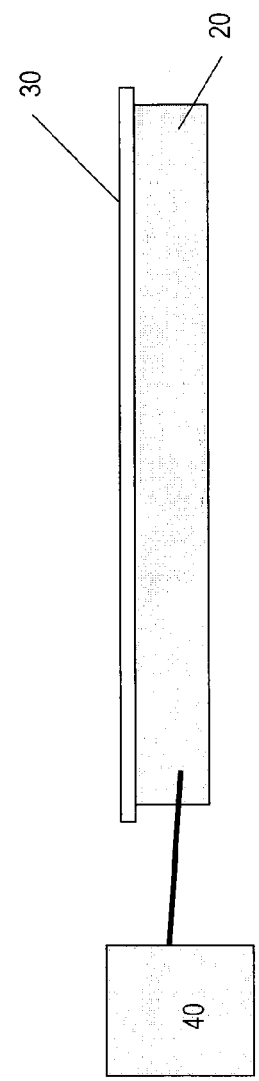
FIG. 1B is a side view of an electrostatic chuck.

Over the course of processing and observing many wafers, it has been recognized that most sticking during declamping occurs at the outer edge of the wafer, where the wafer is in intimate contact with the seal ring. On many ESC designs, the seal ring comprises the largest continuous region where chuck and wafer are in contact. Since the electrostatic clamping force is proportional to the electrode area in communication with the wafer, there will be a large clamping force between the ESC and the wafer at this seal ring. This clamping force could lead to a large residual charge at this region after the applied potential is removed from the ESC which would explain the observed results.

The primary purpose of the seal ring is not to generate a high clamping force, but rather to provide a gas seal so that a pressure typically in the range 1 Torr to 20 Torr can be applied between the wafer and ESC to improve the thermal coupling. In fact, the whole concept of a reduced area or minimum contact area chuck relies on the fact that there is ample electrostatic clamping force generated between ESC and wafer even when most of the wafer is held approximately 10 microns above the surface of the ESC. The present invention seeks to reduce the accumulation of charge build up on the ESC and wafer in the vicinity of the seal ring while still retaining the seal ring as a gas sealing surface. This is achieved by application of a conductive coating to the seal ring of the ESC. This coating can be applied by sputtering, evaporation, chemical vapor deposition, pulsed laser deposition, electroplating, thermal spray, plasma spray, screen printing or even by painting. To demonstrate feasibility, a graphite coating from a soft pencil was applied to the seal ring.

The conductive coating serves two purposes: first, it serves to screen the wafer from the electrostatic field generated by the underlying ESC electrode and thus reduce the local electrostatic clamping force. Secondly, it prevents charge from accumulating on the metalized surface of the ESC. For this reason, noble metals that do not readily form an electrically insulating oxide (e.g., Au, Pt, Rh) are preferred since any native oxide on the surface of the metal would allow charge to accumulate at the metal-oxide interface. Au, Pt and similar noble metals also provide chemical resistance to many of the reactive gases used in semiconductor processing. For economic reasons, Ni and its alloys may serve as a less costly alternative to noble metals.

The coated seal ring need not be comprised of a single conductive layer. For example, two or more layers could be deposited sequentially. The first layer could be chosen to provide good adhesion to the dielectric surface of the ESC seal ring (Ti is known to be well-suited for this purpose). The material contacting the substrate should be inert to the processing conditions, especially if they involve plasmas. An intermediate barrier layer could be used to prevent intermixing of these two layers if so desired.

The coated seal ring makes as effective a seal surface as the bare ESC dielectric. Therefore, the gas seal around the periphery of the ESC is not compromised. However, it should be emphasized that the region of the chuck that is conductively coated no longer contributes to the overall electrostatic clamping force applied to the substrate by the ESC.

An alternative strategy to prevent sticking at the seal ring is possible. Instead of applying a conductive coating to the seal ring, the conductivity of the ESC dielectric in the region of the seal ring can be increased. This can be done by ion implantation of the seal ring and subsequent annealing. By increasing the conductivity of at least some portion of the dielectric at the seal ring, the charge on the surface of the ESC in the vicinity of the seal ring will dissipate more rapidly when the applied potential is removed from the ESC electrodes. For example, reducing the resistivity (increasing the conductivity) of the ESC dielectric at the seal ring by a factor of 10 (i.e., to ~10E7 Ω-cm) can have a similar effect to raising the temperature of a J-R style ESC by 100° C., which was observed to be effective in reducing declamping times and the propensity for substrate sticking.

The efficacy of the conductive seal ring and increased conductivity seal ring to reduce wafer sticking during declamping can be further improved by omission of ESC electrode surfaces directly beneath the seal ring. For this to be effective, the edge of the electrode should be separated from the seal ring by a distance greater than the upper ESC dielectric layer thickness. This is typically of the order of 0.1 mm to 0.3 mm, so a separation of about 0.5 mm or greater is adequate. However, one potential drawback to this additional feature is that, in cases where RF bias is coupled to the wafer through the metal electrodes of the ESC, there will be reduced local RF coupling where there is no electrode structure. This drawback will be of little or minor concern in most practical cases. However, in one embodiment of this invention, it is possible to attach an electrical contact to the conductive coating on the seal ring. This contact can be used to continuously or intermittently:

(i) Electrically ground the conductive coating (this can be useful to ensure that there is no charge on the seal ring during the declamping step);

(ii) Using a DC power supply, apply a DC bias to the conductive coating (this could be used to assist substrate release during declamping or to control the wafer bias during processing); and (iii) Using an AC power supply, apply an alternating current (AC) bias to the conductive coating (the frequencies applied could range from very low frequencies that might be used to assist with the declamping operation to high radio-frequency and microwaves in the range of 50 kHz to 10 GHz; RF and microwave frequencies would preferentially be used to couple to the substrate for processing; these frequencies applied through the conductive coating would be more efficiently coupled into the substrate than if they were coupled through the dielectric of the ESC).

Note that in the absence of an electrical contact to ground or to an external power source, the conductive coating would be effectively electrically isolated by the ESC dielectric (i.e., it would be electrically floating).

To demonstrate feasibility of the conductive seal ring approach, it was observed that GaAs wafers being processed on a Johnson-Rahbek ESC would stick to the seal ring at the edge of the ESC during dechucking. This was a very consistent phenomenon and observed with every wafer run through the process chamber with the process conditions used. The process chamber was then vented and soft graphite was applied to the seal ring using a #8B "Woodless Graphite" drawing pencil (General Pencil Company, Inc., Jersey City, N.J.), followed by rubbing with a cleanroom cloth. This provided a conductive surface locally on the seal ring. After this modification, the same GaAs wafers were run through the process chamber using identical conditions as in the prior experiment. None of the wafers showed any evidence of sticking. Furthermore, the leakage of backside gas across the seal ring was measured the same as without the graphite. Finally, the graphite was removed from the seal ring by exposing the ESC to an oxygen plasma for 60 minutes. The same GaAs wafers were then run through the process chamber using the same conditions as before. In this case, 100% of the wafers stuck to the seal ring during dechucking, confirming that the presence of the graphite was solely responsible for the improved dechucking performance.

Figure 2:
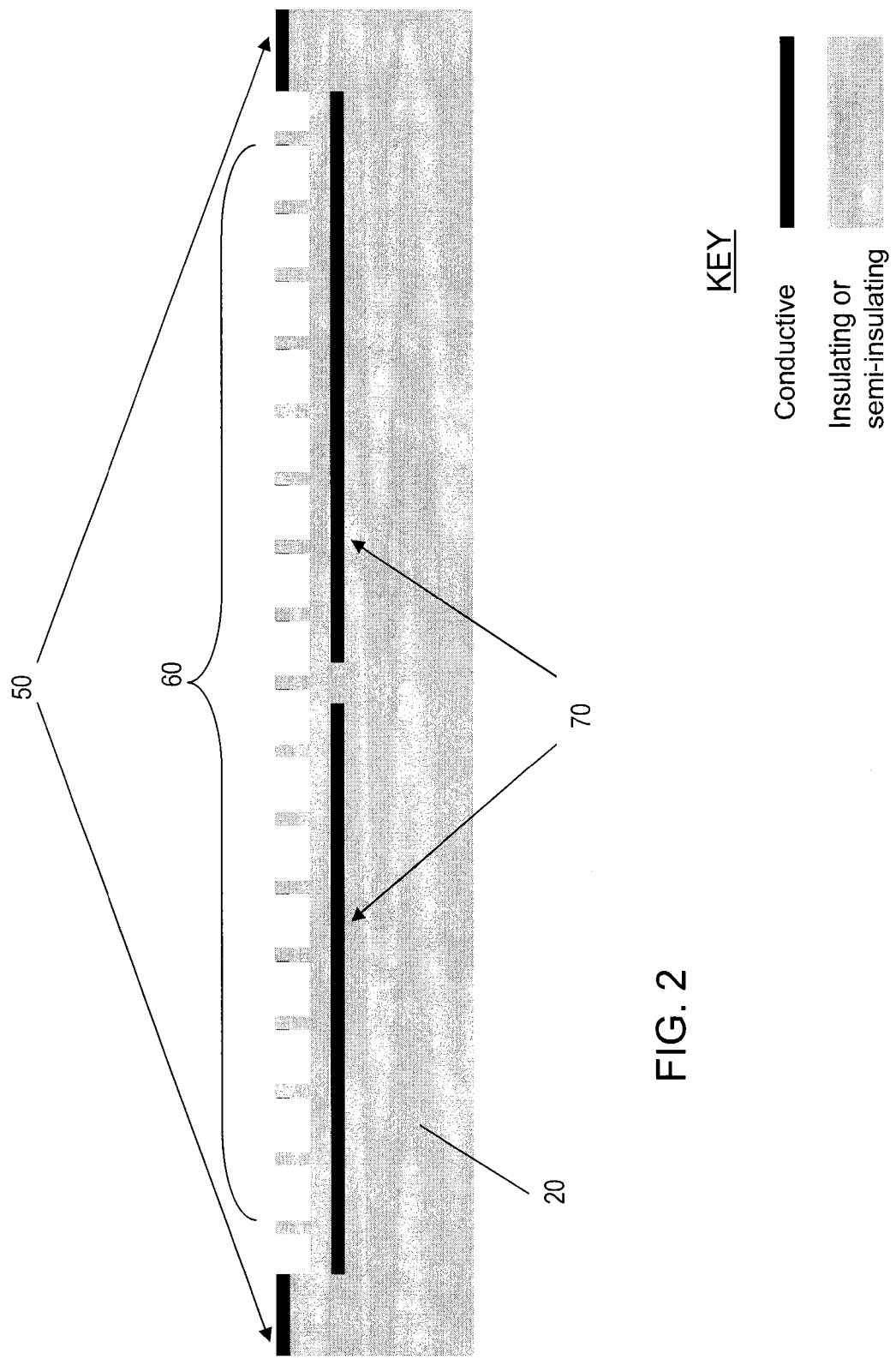
FIG. 2 is a cross sectional view of an electrostatic chuck according to one embodiment of the present invention.
Figure 3:
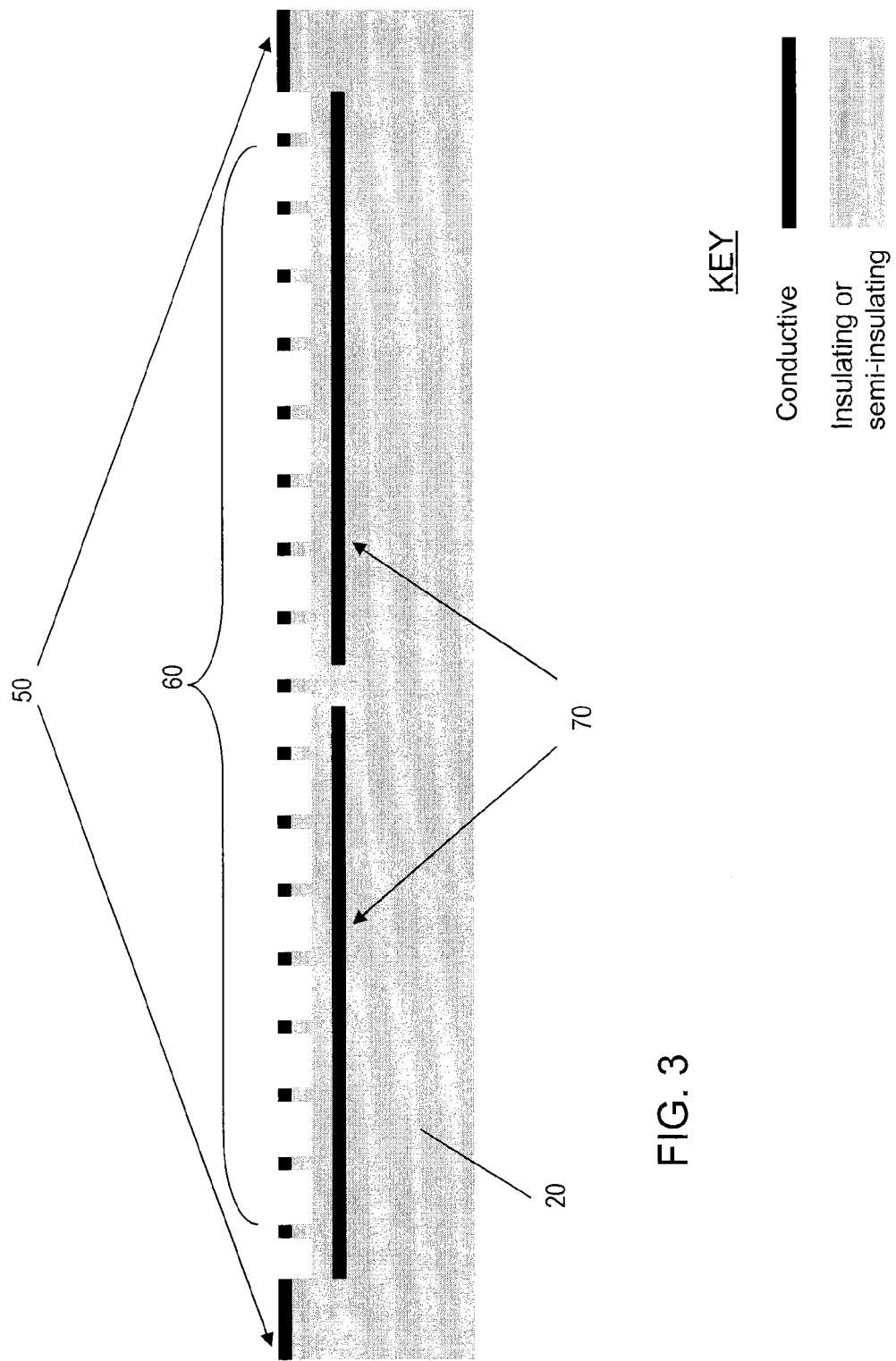
FIG. 3 is a cross sectional view of an electrostatic chuck according to one embodiment of the present invention.

As shown in FIGS. 2 and 3, many electrostatic chucks 10 are constructed with raised areas 60 that contact the substrate. Much of the surface of the chuck 10 is situated a few microns away from the surface with the electrodes 70 in close proximity. It is therefore conceivable to construct an ESC 10 where all points of contact 60 with the substrate are made conductive (not just the seal ring 50). As charge is prevented from accumulating on the surface of the ESC 10 in contact with the substrate, the probability that the substrate will stick during declamping is greatly reduced. This can be extremely beneficial if the surface of the substrate is an insulating or semi-insulating material, especially when process times and therefore clamping times are long. This approach may be of use in the clamping and declamping of large glass plates such as are used in the flat panel display and thin-film solar industries, where currently, dechucking must be done mechanically. If so desired, these raised metalized regions 60 can be electrically connected to the conductive seal ring 50 by thin conductive traces. In the embodiment where the conductive seal ring 50 is connected to ground or an external voltage source, this would allow these regions to be similarly electrically grounded, DC or AC biased.

When high voltages must be applied to an ESC in order to clamp either insulating substrates or conductive substrates through insulating carriers, as in, for example, Oerlikon's multi-wafer carrier, care must be taken not to create an electric field between the metal coated regions of the ESC and the chuck electrodes that exceeds the dielectric strength of the chuck dielectric. In this case, the dielectric could be damaged and the chuck destroyed. A good way to prevent "punch-through" with a partially metal-coated chuck is to provide ~0.5 mm lateral separation between the conductive surfaces of the ESC and the electrodes. This reduces the electrical fields experienced by the chuck dielectric significantly.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. In a substrate processing system, an electrostatic chuck comprising:
a main body having a top surface configured to support the substrate;
a power supply to apply a voltage to said main body; and
a sealing ring disposed between said main body and the substrate, said sealing ring having an applied conductive coating, said conductive coating being applied to said sealing ring from the group consisting of sputtering, evaporation, chemical vapor deposition, pulsed laser deposition, electroplating, thermal spray, plasma spray, screen printing, painting and rubbing.

2. The electrostatic chuck of claim 1 wherein said conductive coating is plasma resistant.

3. The electrostatic chuck of claim 1 wherein said conductive coating has a sheet resistance of less than or equal to about 1000 ohms per square.

4. The electrostatic chuck of claim 1 wherein said conductive coating contains a metal.

5. The electrostatic chuck of claim 4 wherein said metal is selected from the group consisting of Pt, Pd, Rh and Ni.

6. The electrostatic chuck of claim 1 wherein said conductive coating is a conductive oxide.

7. The electrostatic chuck of claim 6 wherein said conductive oxide is selected from the group consisting of ITO and SnO.

8. The electrostatic chuck of claim 1 wherein said conductive coating contains carbon.

9. The electrostatic chuck of claim 8 wherein said conductive coating contains nanotubes.

10. The electrostatic chuck of claim 1 wherein said power supply further comprising one or more electrodes.

11. In a substrate processing system, an electrostatic chuck comprising:
    a main body having a top surface configured to support the substrate;
    a power supply to apply a voltage to said main body; and
    a sealing ring disposed between said main body and the substrate, said sealing ring is implanted with ions.

12. A method for fabricating a conductive seal ring of an electrostatic chuck for use in a substrate processing system, the method comprising:
    providing the seal ring;
    implanting ions into the seal ring; and
    annealing the implanted seal ring.

13. A method for fabricating an electrostatic chuck conductive seal ring for use in a substrate processing system, the method comprising:
    providing the electrostatic chuck seal ring; and
    applying a conductive coating to the electrostatic chuck seal ring, said application of the coating being carried out from the group consisting of sputtering, evaporation, chemical vapor deposition, pulsed laser deposition, electroplating, thermal spray, plasma spray, screen printing, painting and rubbing.

14. The method for fabricating an electrostatic chuck conductive seal ring according to claim 13 wherein said application of said conductive coating further comprising:
    applying an initial adhesion layer to the electrostatic chuck seal ring;
    applying an intermediate barrier layer to the initial adhesion layer; and
    applying a conductive layer to the intermediate barrier layer.

15. The method for fabricating an electrostatic chuck conductive seal ring according to claim 13 wherein said conductive coating is plasma resistant.

16. The method for fabricating an electrostatic chuck conductive seal ring according to claim 13 wherein said conductive coating has a sheet resistance of less than or equal to about 1000 ohms per square.

17. The method for fabricating an electrostatic chuck conductive seal ring according to claim 13 wherein said conductive coating contains a metal.

18. The method for fabricating an electrostatic chuck conductive seal ring according to claim 17 wherein said metal is selected from the group consisting of Pt, Pd, Rh and Ni.

19. The method for fabricating an electrostatic chuck conductive seal ring according to claim 13 wherein said conductive coating is a conductive oxide.

20. The method for fabricating an electrostatic chuck conductive seal ring according to claim 19 wherein said conductive oxide is selected from the group consisting of ITO and SnO.

21. The method for fabricating an electrostatic chuck conductive seal ring according to claim 13 wherein said conductive coating contains carbon.

22. The method for fabricating an electrostatic chuck conductive seal ring according to claim 21 wherein said conductive coating contains nanotubes.

* * * * *